(12) United States Patent
Chiu et al.

(10) Patent No.: US 7,046,068 B2
(45) Date of Patent: May 16, 2006

(54) CMOS-BASED RECEIVER FOR COMMUNICATIONS APPLICATIONS

(75) Inventors: Janice Chiu, Tustin, CA (US); Hooman Darabi, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/832,237

(22) Filed: Apr. 27, 2004

(65) Prior Publication Data

US 2005/0237100 A1    Oct. 27, 2005

(51) Int. Cl.
*G06F 7/44* (2006.01)

(52) U.S. Cl. ...................... 327/359; 455/293
(58) Field of Classification Search ........ 327/355–362; 455/326, 333, 209, 293
See application file for complete search history.

(56) References Cited

U.S. PATENT DOCUMENTS

| | | | | |
|---|---|---|---|---|
| 4,861,154 A | * | 8/1989 | Sherwin et al. ............ | 351/205 |
| 5,630,228 A | * | 5/1997 | Mittel ......................... | 455/326 |
| 5,768,700 A | * | 6/1998 | Kardontchik ............... | 455/333 |
| 6,026,286 A | * | 2/2000 | Long .......................... | 455/327 |
| 6,639,447 B1 | * | 10/2003 | Manku et al. .............. | 327/359 |
| 6,865,382 B1 | * | 3/2005 | Behzad ....................... | 455/323 |
| 6,889,037 B1 | * | 5/2005 | Darabl ........................ | 455/323 |
| 2005/0042994 A1 | * | 2/2005 | Otaka et al. ............. | 455/180.3 |

* cited by examiner

*Primary Examiner*—My-Trang Nu Ton
(74) *Attorney, Agent, or Firm*—Squire, Sanders & Dempsey LLP

(57) ABSTRACT

A receiver and receiver front end having multiple independent differential inputs, multiple independent differential low-noise amplifiers, and two sets of double-balanced IQ mixers. The double-balanced mixers include cross-coupled PMOS devices that dynamically inject current at zero-crossing points to cancel out tail currents in the mixers. Also, methods of operating the above-discussed receiver and receiver front end.

20 Claims, 5 Drawing Sheets

CMOS-BASED RECEIVER FOR COMMUNICATIONS APPLICATIONS

BACKGROUND OF THE INVENTION

1. Field of the Invention

Certain embodiments of the present invention are generally directed at receivers that may, for example, be used for cellular system applications. Certain other embodiments of the present invention are generally directed at methods for operating such receivers.

2. Description of the Related Art

As personal, mobile, wireless communication devices have become more and more prevalent, low-cost, low-power receivers that may be implemented in such devices have been developed. Such receivers are generally preferred to have high degrees of sensitivity and linearity, particularly when used in receiver front-end portions. Therefore, because it has been demonstrated that bipolar complimentary metal oxide semiconductor (BiCMOS) technology is capable of providing the sensitivity and linearity desired, BiCMOS technology is often integrated into receivers according to the related art.

Using BiCMOS technology, the requirements of at least two mobile wireless communications systems, global system for mobile communications (GSM) and personal communications systems (PCS), have been met. Unfortunately, BiCMOS technology requires that a high number of masks be used when manufacturing receivers. Hence, the costs and complexity of manufacturing BiCMOS-based receivers are relatively high.

As wireless communication technology has continued to evolve, CMOS-based receivers have been studied as an alternative to the above-discussed BiCMOS technology. Using CMOS technology, relatively low-cost receivers may be produced. However, the noise of currently-available CMOS-based receivers is relatively high, and the linearity provided by such receivers still leaves much to be desired.

FIG. 1 illustrates a circuit diagram of a portion of CMOS-based single-balanced mixer 100 which may be included in a CMOS-based receiver according to the related art. Mixer 100 includes, in first transistor device 140, first local oscillator 110 and, in second transistor device 150, second local oscillator 120. Because neither oscillator 110 nor 120 is an ideal current source, noise component 130 is also included in the circuit diagram. Component 130 represents the equivalent noise voltage contributed from oscillator 110 and gate resistance thermal noise of transistor device 140. In other words, component 130 represents a combination of all nonlinear noise components associated with device 140.

FIG. 2A, in graph 200 contained therein, illustrates the differential voltage 205 that flows into single balanced mixer 100 over time (t) from local oscillators 110 and 120 when in operation. Also illustrated as a dashed line in graph 200 is an oscillating noise voltage ($V_n$) that modulates the local oscillator signals and that is present due to the fact that local oscillators 110 and 120 are not ideal sources.

Graph 210, in FIG. 2B, illustrates the combined differential output mixer current $i_0$ that flows out of mixer 100 illustrated in FIG. 1. As shown in graph 210, the output current $i_0$ takes the form of a step function that switches from a positive value (+I) equal to the maximum magnitude of the oscillator current to a negative value (−I) that is also equal in amplitude to the maximum magnitude of the oscillator current.

Current $i_o$ may be decomposed into two components. The first component is an ideal differential output mixer current that is free of flicker noise and that has a 50% duty cycle. This first component, though not illustrated in FIGS. 2A–2C, takes the form of a step function that switches between upper and lower plateaus when differential voltage 205 crosses the t-axis in FIG. 2A.

Graph 220, illustrated in FIG. 2C, illustrates the second component of current $i_o$. This second component includes current spikes that represent flicker noise when mixer 100 is in operation. The current spikes are inherently present due to the configuration of mixer 100, and are caused by the leakage current that appears upon circuit switching.

The flicker noise illustrated in graph 220 leads to an offset of the above-discussed ideal differential output mixer current step function. In other words, without flicker noise, the steps in the step function illustrated in graph 210 would coincide exactly in time with when voltage 205 switched from a positive value to a negative value in graph 200. However, because flicker noise is superimposed on an ideal step function to represent the actual behavior of mixer 100 according to the related art, the positive or negative current spikes that represent flicker noise either increase or decrease the width of the steps in the ideal step function, thereby causing an offset between the edge of a step and the time at which voltage 205 switches from a positive value to a negative value. This offset reduces the sensitivity and linearity of currently-available CMOS-based wireless communication devices.

At least in view of the above, what is needed are new CMOS-based devices that may be used in wireless communication devices. Such devices should have higher sensitivity, lower noise, and higher degrees of linearity than currently available systems. What is also needed are methods for manufacturing and operating such devices.

SUMMARY OF THE INVENTION

According to certain embodiments of the present invention, a first receiver is provided. Typically, this receiver includes a first signal input that is configured to support a first signal. Also, this receiver often includes a complementary metal oxide semiconductor (CMOS)-based first mixer configured to alter a frequency of the first signal, wherein the first mixer is operably connected to the first signal input, and wherein the first mixer includes a noise-reduction device configured to inject a first current that counter-acts flicker currents generated within the first mixer while the first mixer is in operation.

According to certain other embodiments of the present invention, a method of operating a receiver is provided. Generally, the method includes the step of using a complementary metal oxide semiconductor (CMOS)-based mixer in the receiver to change a frequency of an oscillating input signal. Commonly, the method also includes the step of compensating for a tail current that arises in the mixer by providing a counter-acting current.

According to yet other embodiments of the present invention, a second receiver is provided. Typically, this receiver includes complementary metal oxide semiconductor (CMOS)-based mixing means for changing a frequency of an oscillating input signal. Often, this receiver also includes compensatory means, within the mixing means, for compensating for a tail current that arises in the mixing means by providing a counter-acting current.

BRIEF DESCRIPTION OF THE DRAWINGS

For proper understanding of the invention, reference should be made to the accompanying drawings, wherein.

DETAILED DESCRIPTION OF THE PREFERRED EMBODIMENT(S)

Figure 3:
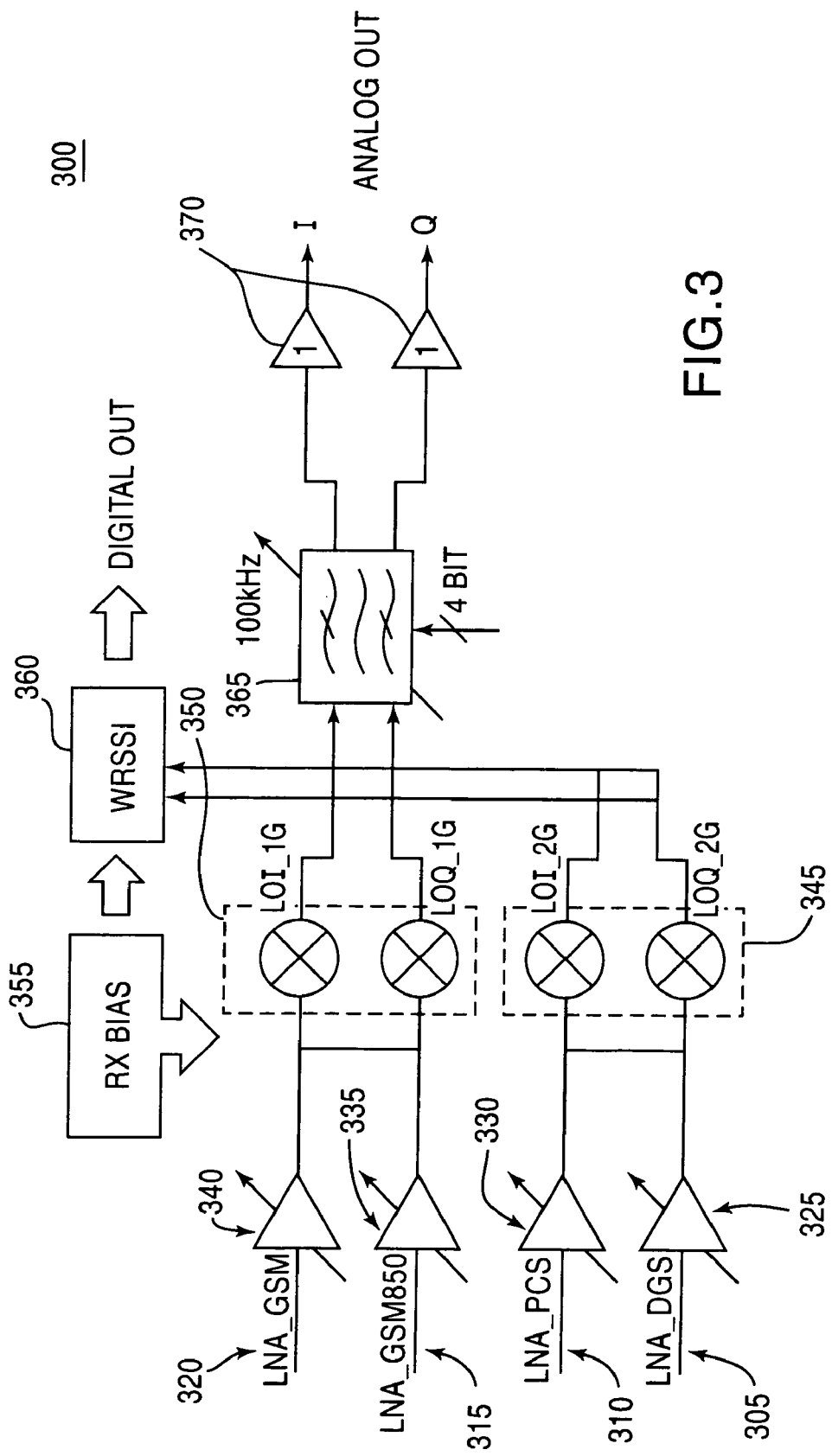
FIG. 3 illustrates a block diagram of a receiver according to certain embodiments of the present invention.

FIG. 3 illustrates a block diagram of a representative receiver 300 according to certain embodiments of the present invention. It should be noted that any or all of the components included in the block diagram may be differential, including the inputs to the amplifiers discussed below.

The representative receiver 300 includes a front end region that includes four signal inputs 305, 310, 315, 320, four low-noise amplifiers (LNAs) 325, 330, 335, 340, and two IQ mixers 345, 350. Representative receiver 300 also includes receiver (RX) bias 355, Wide-Band Received Signal Strength Indicator (WRSSI) circuit 360, filter 365, and amplifiers 370. One skilled in the art of the present invention will appreciate that receivers, transceivers, and other devices according to certain embodiments of the present invention may include components other than those illustrated in FIG. 3. Also, one skilled in the are will appreciate that one or more of the components illustrated in FIG. 3 may be substituted for or left out according to other embodiments of the present invention.

According to certain embodiments of the present invention, signal inputs 305, 310, 315, 320 are each configured to support a signal that is sent to the receiver. Each of the signals supported by the respective inputs typically has a different frequency from the other signals going into the receiver. For example, for embodiments of the present invention that are configured for GSM and/or PCS applications, the signal coming in though first signal input 305 may be at a frequency of 1900 mHz, the signal coming in through second signal input 310 may be at a frequency of 1800 mHz, the signal coming into third signal input 315 may be at a frequency of 850 mHz, and the signal coming in through fourth signal input 320 may be at a frequency of 900 mHz.

Each of the inputs 305, 310, 315, 320 is illustrated in FIG. 3 as being operably connected to one LNA. In turn, each LNA illustrated in FIG. 3 is operably connected to either first IQ mixer 345 or second IQ mixer 350. In FIG. 3, LNAs 325 and 330, which support signals of relatively high frequencies, are each operably connected to first IQ mixer 345, while LNAs 335 and 330, which each support signals of relatively low frequencies, are both operably connected to IQ mixer 350.

Receiver 300, and the components included therein, can be manufactured in a manner that allows for receiver 300 to be readily integrated with other components of wireless communication devices during manufacturing. As such, according to certain embodiments of the present invention, receiver 300 is manufactured as a complimentary metal oxide semiconductor (CMOS)-based device.

IQ mixers 345 and 350 are, according to certain embodiments of the present invention, configured to alter the frequencies of the input signals illustrated in FIG. 3. For example, although wireless telecommunication systems typically transmit coded and/or modulated input signals at a certain carrier frequency, such as, for example, radio frequency (RF), to the LNAs, down-conversion to an intermediate frequency (IF) signal is often necessary for operation of the receiver. Hence, mixers 345 and 350, according to certain embodiments of the present invention, convert RF input signals to IF signals. Such down-conversion using mixers is know to those of skill in the art of the present invention and will not be discussed further.

Figure 4:
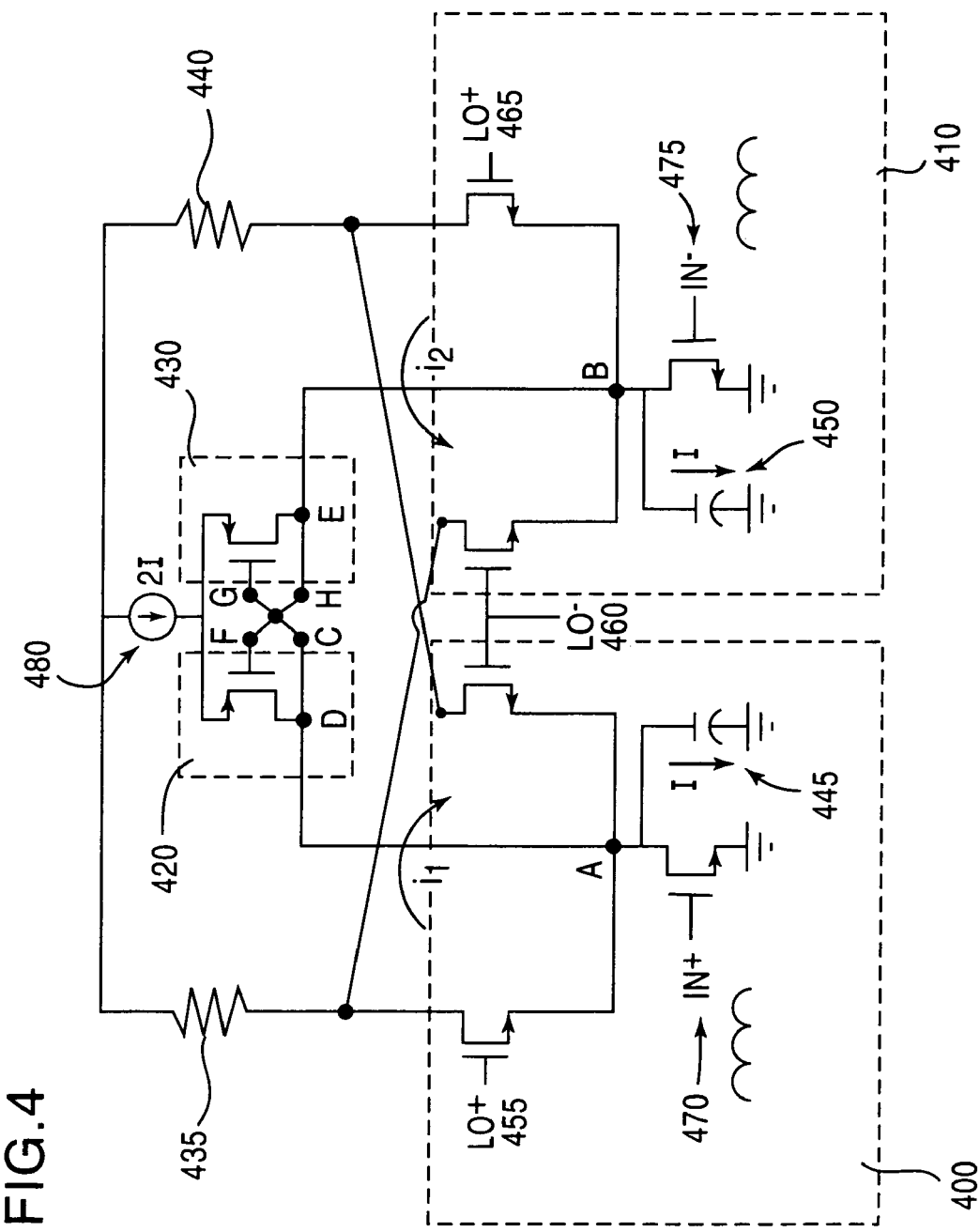
FIG. 4 illustrates a circuit diagram of a portion of a double-balanced mixer according to certain embodiments of the present invention.

FIG. 4 illustrates a circuit diagram of a portion of a double-balanced or gilbert-type mixer according to certain embodiments of the present invention that may be used as a noise-reduction device. A set of two of the circuit/device illustrated in FIG. 4 may be included, for example, in IQ mixers 345 and/or 350 of the receiver 300 illustrated in FIG. 3. In such a set, one mixer may serve as mixer I and the other double-balanced mixer may serve as mixer Q.

The double-balanced mixer illustrated in FIG. 4 is configured to reduce or eliminate flicker noise. According to certain embodiments of the present invention, the noise-reduction device illustrated in FIG. 4 is configured to inject a current that counter-acts the above-discussed flicker noise currents that are commonly generated within mixers while the mixers are in operation.

In FIG. 4, the double-balanced mixer circuit illustrated includes two mixers 400, 410 and two positive metal oxide semiconductors (PMOS) devices 420, 430. Mixers 400 and 410 and PMOS devices 420, 430 are operably connected to each other in a circuit that also includes two resistors 435, 440, a set of linear oscillators (LOs) 455, 460, 465, two inputs 470, 475, and a current source 480. It should be noted that FIG. 4 is only a representative configuration for certain embodiments of the present invention, and that one skilled in the art will appreciate that any of the components illustrated in FIG. 4 may be modified without straying from the present invention.

In FIG. 4, two variable capacitors 445, 450 are illustrated to represent parasitic capacitance. Therefore, capacitors 445, 450 are typically not physically present as separate capacitors.

PMOS devices 420 and 430 are cross-coupled, as illustrated by the crossing lines C–G and F–H. Hence, the operation of mixers 400 and 410 is linked. How the cross-coupling illustrated in FIG. 4 impacts the overall operation the device and reduces noise in mixers 400 and 410 will be discussed below with reference to FIG. 6, which provides the steps of a representative method of operating devices according to certain embodiments of the present invention.

The double-balanced mixer illustrated in FIG. 4 generally receives differential inputs from outputs of a differential LNA at IN⁺ input 470 and IN⁻ input 475. Differential LO signals are also commonly received from LO 455, LO 460, and LO 465, and typically have substantially identical voltage swings that are 180° different in phase. Hence, in FIG. 4, LO 455 may have the same phase as LO 465.

Figure 5:
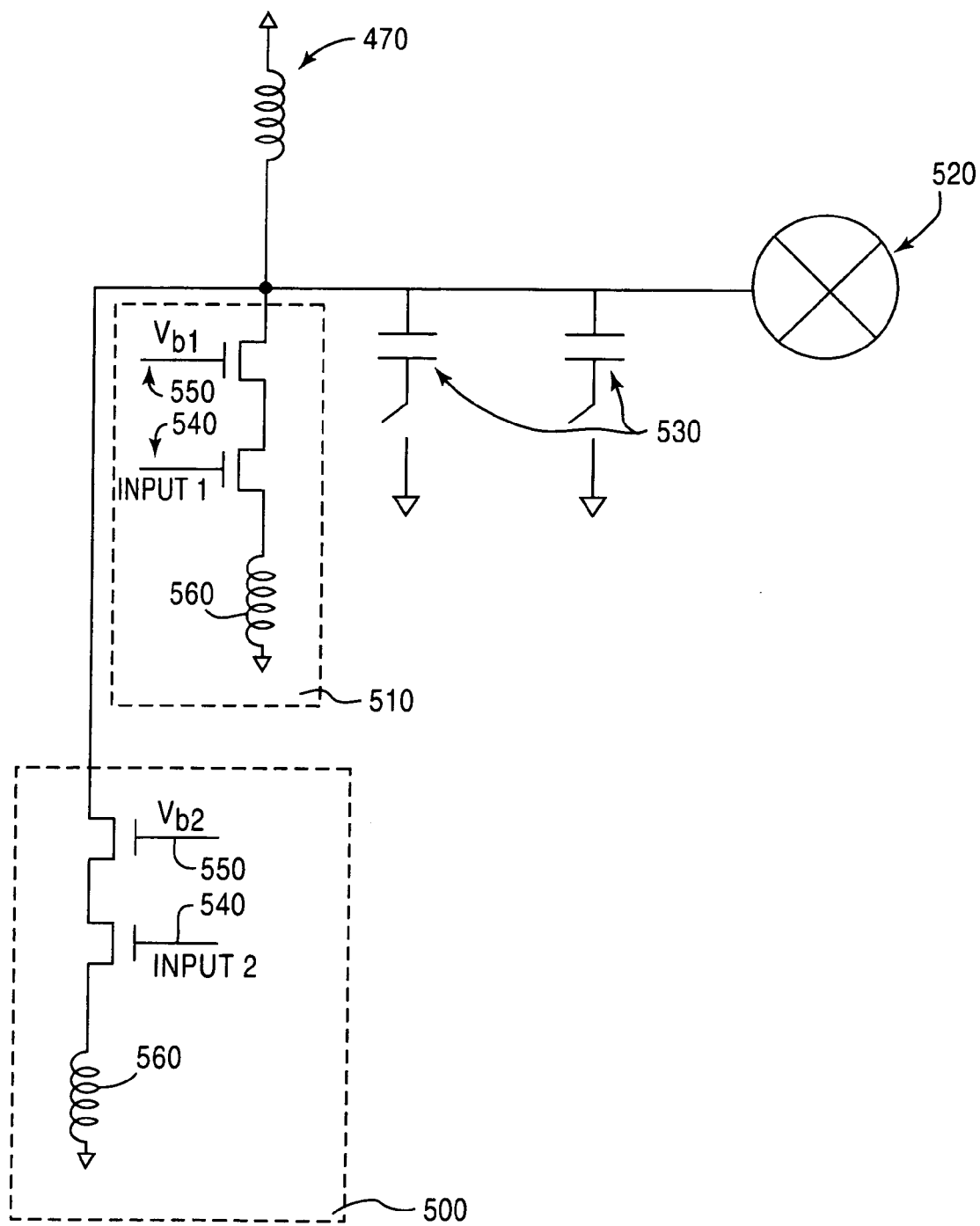
FIG. 5 illustrates a circuit diagram of a portion of a low-noise amplifier (LNA) and mixer arrangement according to certain embodiments of the present invention.

FIG. 5 illustrates a portion of two LNAs 500, 510 that may be included, for example, in representative receiver 300 illustrated in FIG. 3. FIG. 5 also illustrates a representative mixer 520 that is operably connected to LNAs 500, 510. Although LNAs 500, 510 are illustrated as being of a single-ended design, differential LNAs and mixers may also be used.

Between LNAs 500 and 510 and mixer 520, FIG. 5 also illustrates a set of switch capacitors 530. Although only two switch capacitors 530 are illustrated in FIG. 5, according to certain embodiments of the present invention, one or more switch capacitors 530 may be used. Also, although only two LNAs are illustrated in FIG. 5, no particular lower or upper limits on the number of LNAs that may be operably connected to mixer 520 are placed on the embodiments of the present invention.

Each LNA 500, 510 illustrated in FIG. 5 includes and input 540 and a base voltage 550. Each LNA 500, 510 also includes an inductive degeneration component 560. In FIG. 5, the LNAs 500, 510 also share an inductive load component 570, which is operably connected to each LNA illustrated.

In operation, the circuit illustrated in FIG. 5, with appropriate setting of one or more switch capacitors 530, allows for the frequency of an LNA output signal to be tuned to a desired frequency band or range, such that signals from both LNA 500 and LNA 510 may be input into the same mixer 520. The use of such switch capacitors 530 to tune signals optimizes gain transfer in receivers such as, for example, receiver 300 illustrated in FIG. 3.

In FIG. 5, if LNA 510 receives signals at a frequency of 900 MHz and LNA 500 receives signals at a frequency of 850 MHz, LNA 500 may be powered down by shutting off the bias therein. Then, when LNA 510 is "on", switched capacitors 530 may be adjusted to tune the output signal from LNA 510 to around 900 MHZ, or to another frequency that optimizes gain transfer.

In the alternative, LNA 510 may be powered down and switch capacitors 530 may be adjusted such that the output signal from LNA 500 is tuned to around 850 MHz. Either way, since mixer 520 may be designed to be operable with signals of 900 MHz or 850 Mhz, mixer 520 may translate a received signal band or frequency to an IF frequency that is desirable for the overall system.

Figure 6:
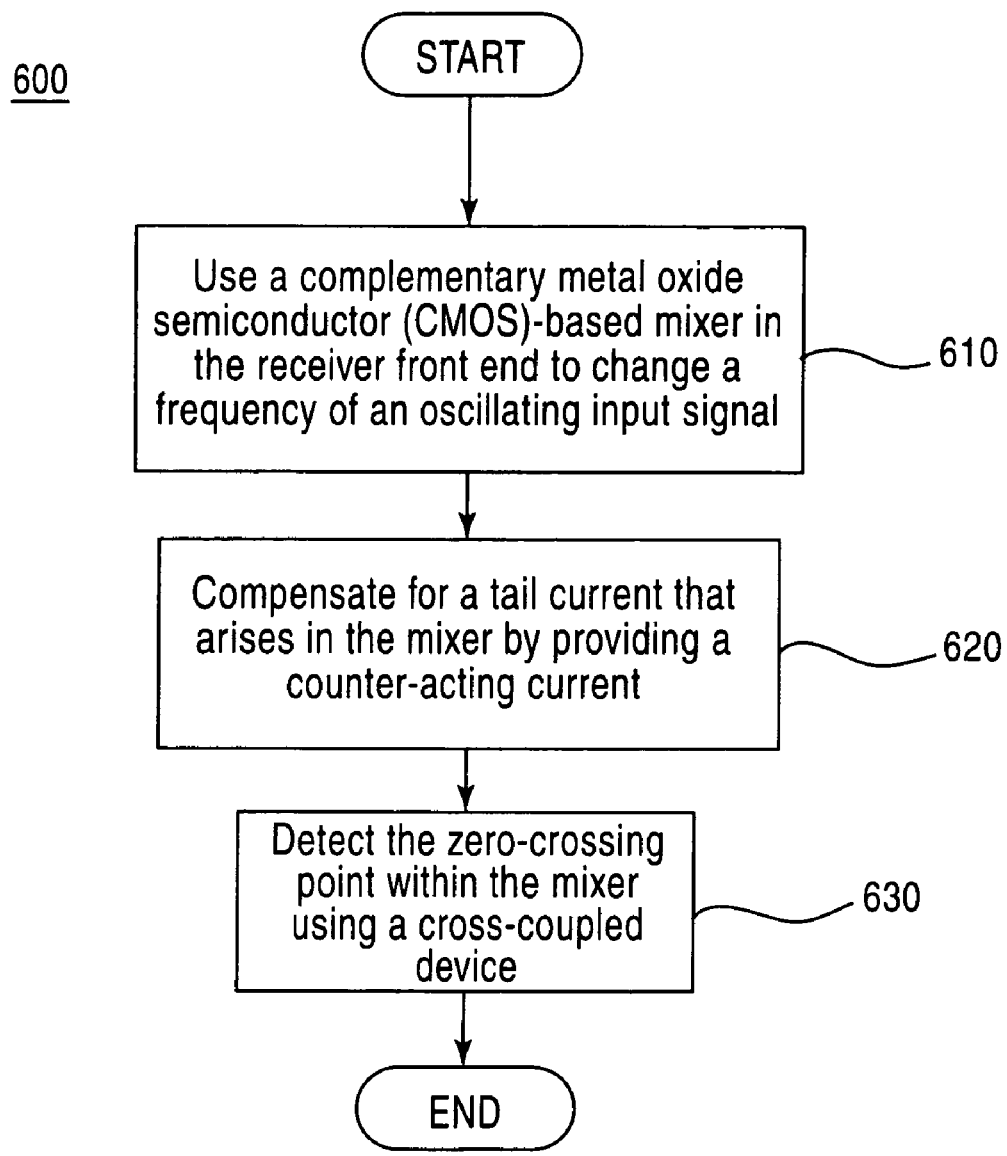
FIG. 6 illustrates a flowchart that includes the steps of a method of operating a receiver according to certain embodiments of the present invention.

FIG. 6 illustrates a flowchart 600 that includes the steps of a representative method according to certain embodiments of the present invention of operating a receiver, transceiver, and/or receiver front end. In step 610 of flowchart 600, a complimentary metal oxide semiconductor (CMOS)-based mixer is used in a receiver front end to change a frequency of an oscillating input signal. For example, the mixer may be used to transform or down-convert an RF signal to an IF signal. As this is a classic use for a mixer, and since those skilled in the art understand how mixers may be used to change the frequency of input signals, no additional description of this step is included herein.

Step 620 of flowchart 600 recites compensating for a tail current that arises in the mixer by providing a counter-acting current. Typically, this counter-acting current is dynamic in the sense that it is only provided when there is a tail current present.

A representative tail current, in the form of flicker noise, was discussed with reference to graph 220 in FIG. 2. According to certain embodiments of the present invention, other unwanted signals and/or noise may be counter-acted by providing the counter-acting current included in step 620.

The counter-acting current of step 620 may be provided using, for example, the noise-reduction device illustrated in FIG. 4 and discussed above, or any modification thereto that will become apparent to one of skill in the art. As discussed above, when compensating for a tail current or flicker noise, the counter-acting current is typically provided dynamically. For example, the counter-acting current may be provided exclusively at zero-crossing points of an oscillating input signal, corresponding to when the switch devices in the mixer are switching.

Figure 1:
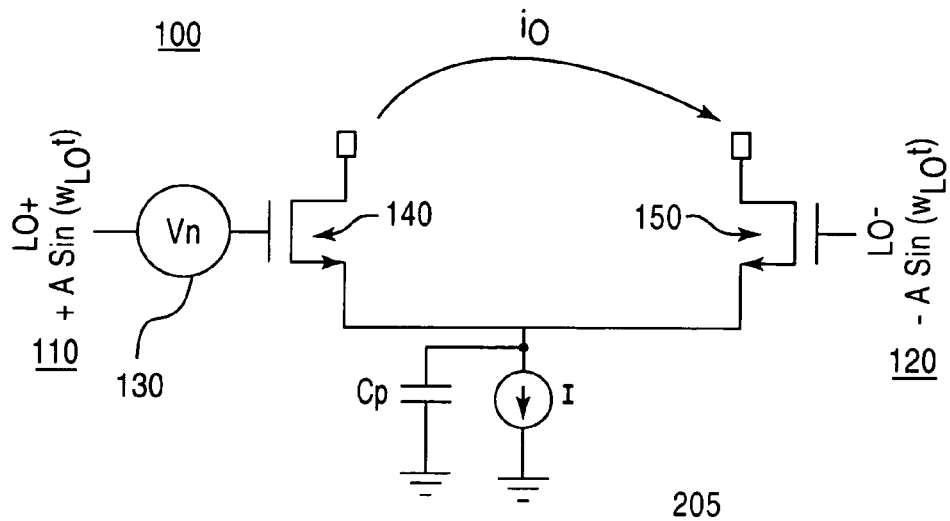
FIG. 1 illustrates a circuit diagram of a portion of a CMOS-based single-balanced mixer according to the related art that includes a first local oscillator and a second local oscillator.
Figure 2A:
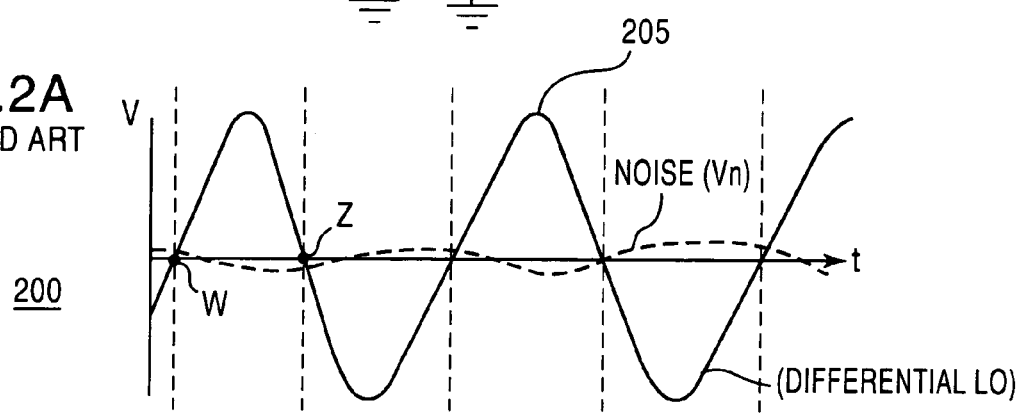
FIG. 2A includes a graph that illustrates, as a function of time, a differential voltage swing that flows into a single-balanced mixer, such as the mixer illustrated in FIG. 1, and a noise signal.
Figure 2B:
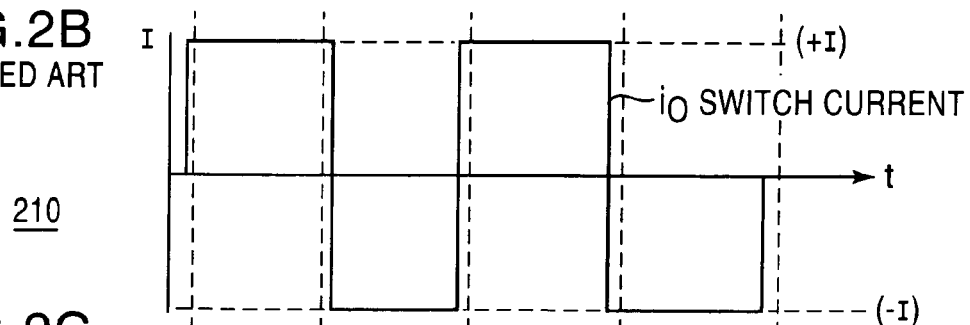
FIG. 2B includes a graph that illustrates, as a function of time, a combined differential output mixer current in the mixer illustrated in FIG. 1.
Figure 2C:
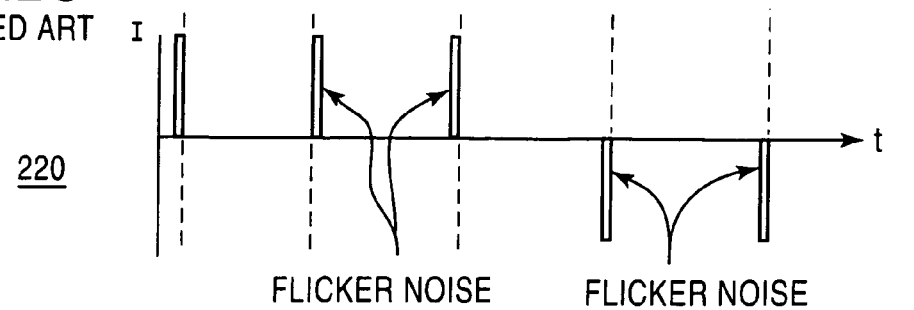
FIG. 2C includes a graph that illustrates, as a function of time, flicker noise in the mixer illustrated in FIG. 1.

In graph 200 of FIG. 2A, the counter-acting current, which is generally not a fixed current, may be provided at points W and/or Z, where the oscillating signal current crosses the t-axis. When the counter-acting current is provided from a cross-coupled device, such as the device illustrated in FIG. 4, the counter-acting current may be injected by one or more PMOS-based components.

In FIG. 4, $i_1$ and $i_2$ each equal $(I+i_n)$, where I is the tail current of each single-balanced mixer 400, 410 and $i_n$ is the noise current superimposed on top of I. Because the mixers 400, 410 are switched according to LO signals, if $i_n$ is ignored for the time being, the differential current at the output of either mixer 400, 410 has an amplitude of I.

According to certain embodiments of the present invention, $i_n$ is also preferably reduced or eliminated. Generally, $i_n$ may be represented as:

$$i_n = \text{function}[(4I/ST), v_n]$$

where I equals the differential tail current amplitude of each single-balanced mixer, S is the slope of the differential LO swing over the non-linear noise voltage $v_n$ at a zero-crossing of LO, and T is the frequency at which the tail current (I) oscillates. In view of the above, the value of $i_n$ is proportional to I.

According to the above equation, in order to reduce or eliminate $i_n$, I may be reduced or S may be increased. The differential current of the double-balanced mixer is 2I. Therefore, according to certain embodiments of the present invention, PMOS devices 420 and 430 inject a current of amplitude 2I to counter-act tail currents which eliminates $i_n$ at zero crossings. Also, according to certain embodiments of the present invention, S is maximized by providing the differential LO swing as a step function.

Step 630 in flowchart 600 specifies detecting the zero-crossing point within a mixer, such as the double-balanced mixer illustrated in FIG. 4, using a cross-coupled device. Since, as discussed above, noise that affects mixer operation occurs at or near zero-crossing points, detection of zero-crossing points allows for the above-discussed counter-current to be injected at those points, thereby minimizing noise.

With reference to the cross-coupled mixer illustrated in FIG. 4, detection of zero-crossing points of an input signal is inherent to the circuit. In other words, due to the connections between the PMOS devices 420, 430, the LOs 455, 460, 465, the inputs 470, 475, and the variable capacitors 445, 450, zero-crossings will be detected and will automatically trigger one of the PMOS devices to inject a counter-acting current into the mixers 400, 410. Hence, the detection step 630 illustrated in flowchart 600 does not necessitate inclusion of any components beyond those illustrated in FIG. 4. However, according to certain embodiments of the present invention, noise may be detected and/or a counter-acting current may be injected from outside of the mixer.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

We claim:

1. A receiver, comprising:
a first signal input that is configured to support a first signal having a first frequency;
a complementary metal oxide semiconductor (CMOS)-based first mixer configured to alter a frequency of the first signal;
an amplifier operatively connected to the first mixer; and
a switch capacitor operably connected between the amplifier and the first mixer to optimize a gain transfer to the first mixer,
wherein the first mixer is operably connected to the first signal input, and wherein the first mixer includes a noise-reduction device configured to inject a first current that counter-acts flicker currents generated within the first mixer while the first mixer is in operation.

2. The receiver of claim 1, further comprising:
a second signal input that is configured to support a second signal, wherein the second signal input is operably connected to the first mixer.

3. The receiver of claim 2, wherein the second signal input supports second signal having a second frequency different from the first frequency.

4. The receiver of claim 1, wherein the noise-reduction device comprises a cross-coupled switch.

5. The receiver of claim 1, wherein the noise-reduction device comprises a positive metal oxide semiconductor (PMOS) device.

6. The receiver of claim 5, wherein the noise-reduction device comprises a cross-coupled PMOS device.

7. The receiver of claim 1, wherein the first mixer comprises an IQ-mixer.

8. The receiver of claim 1, further comprising a second mixer that is operably connected to the first mixer.

9. The receiver of claim 8, further comprising a second signal input and a third signal input, each of which is operably connected to the second mixer.

10. A method of operating a receiver, the method comprising the steps of:
providing a complementary metal oxide semiconductor (CMOS)-based mixer in the receiver;
changing a frequency of an oscillating input signal with the mixer;
operably connecting an amplifier to the mixer;
optimizing a gain transfer to the mixer using a switch capacitor connected between the amplifier and the mixer; and
compensating for a tail current that arises in the mixer by providing a counter-acting current.

11. The method of claim 10, wherein the compensating step comprises providing the counter-acting current at a zero-crossing point of the oscillating input signal.

12. The method of claim 11, further comprising the step of:
detecting the zero-crossing point within the mixer using a cross-coupled device.

13. The method of claim 10, wherein the compensating step comprises providing the counter-acting current from a positive metal oxide semiconductor (PMOS)-based device.

14. The method of claim 13, wherein the compensating step comprises providing the counter-acting current from a cross-coupled PMOS-based device.

15. The method of claim 10, wherein the compensating step comprises providing the counter-acting current from a cross-coupled device within the mixer.

16. The method of claim 10, wherein the compensating step comprises providing a dynamic counter-acting current.

17. The method of claim 10, wherein the using step comprises using an IQ mixer.

18. A receiver, comprising:
complementary metal oxide semiconductor (CMOS)-based mixing means for changing a frequency of an oscillating input signal;
amplifying means operably connected to the mixing means;
switch capacitor means operably connected between the amplifying means and the mixing means for optimizing a gain transfer to the mixing means; and
compensating means, within the mixing means, for compensating for a tail current that arises in the mixing means by providing a counter-acting current.

19. The receiver of claim 18, wherein the compensating means comprise a cross-coupled device.

20. The receiver of claim 19, wherein the compensating means comprise a cross-coupled positive metal oxide semiconductor (PMOS)-based device.

* * * * *